(12) United States Patent
Kent

(10) Patent No.: US 6,529,623 B1
(45) Date of Patent: Mar. 4, 2003

(54) STEPPER LENS SPECIFIC RETICLE COMPENSATION FOR CRITICAL DIMENSION CONTROL

(75) Inventor: Eric Kent, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/386,467

(22) Filed: Aug. 31, 1999

(51) Int. Cl.[7] ................................................. G06K 9/00
(52) U.S. Cl. ......................................... 382/149; 438/14
(58) Field of Search ................................ 382/149, 145; 438/14, 16; 348/87, 126; 700/110, 121

(56) References Cited

U.S. PATENT DOCUMENTS

| 4,503,506 A | | 3/1985 | Sturges, Jr. | |
|---|---|---|---|---|
| 4,926,489 A | | 5/1990 | Danielson et al. | |
| 5,308,991 A | * | 5/1994 | Kaplan | 250/492.22 |
| 5,392,361 A | | 2/1995 | Imaizumi et al. | |
| 5,685,588 A | | 11/1997 | Wong et al. | |
| 5,723,233 A | * | 3/1998 | Garza et al. | 430/22 |
| 5,774,222 A | * | 6/1998 | Maeda et al. | 250/548 |
| 5,888,675 A | * | 3/1999 | Moore et al. | 430/30 |

OTHER PUBLICATIONS

Liu et al. "Binary and Phas Shifting Mask Design for Optical Lithography." IEEE Trans. on Semiconductor Manufacturing, vol. 5, No. 2, May 1992, pp. 138–152.*
Krivokapic et al. "Intrafield Effects and Device Manufacturability: A Statistical Simulation Approach." 3rd Int. Workshop on Statistical Metrology., Jun. 7, 1998, pp. 36–39.*
Kobinata et al. "Proximity Effect Correction by Pattern Modified Stencil Mask in Large Field Projection Electron-Beam Lithography." Int. Conf. Microprocesses and Nanotechnology, Jul. 16, 1998, pp. 132–133.*
Saito et al. "Aberration Tolerance for 130 nm Lithography from View Point of Process Latitude." Int. Conf. Microprocesses and Nanotechnology, Digest of Papers, Jul. 8, 1999, pp. 202–203.*

* cited by examiner

*Primary Examiner*—Jon Chang

(57) ABSTRACT

In order to obviate the problem wherein localized lens aberration causes a pattern of low yield which cannot be corrected by conventional stepper correction/adjustment and which leads to the determination that the stepper lens is the source of the problem, the reticle is modified to produce an error which is selected to cancel the error that is being produced by the lens aberration and thus enable desired critical dimensions to produce on all dice. The modified reticle is then dedicated to the particular stepper.

2 Claims, 2 Drawing Sheets

STEPPER LENS SPECIFIC RETICLE COMPENSATION FOR CRITICAL DIMENSION CONTROL

BACKGROUND OF THE INVENTION

1. Field of the Invention

The present invention relates generally to steppers and more specifically to a production control technique involving the identification of a lens aberration based problem and the corrective modification of a reticle associated with the lens.

2. Related Art

Steppers are highly sophisticated and expensive pieces of apparatus which are used in the production of semiconductor products such as VLSI chips. The most commonly used photolithic process carried out using this type of apparatus are step and repeat and step and scan type operations.

During production, a yield fall out may be observed wherein certain die exhibit certain types of failure. That is to say, within given field a repetitive type of fault or signature may be produced. In most instances, these types of problems can be corrected using conventional measures/techniques. With the individual processes which are carried out, use is made of spot checks of a line/space patterns to check and adjust stepper/process performance. Critical dimension (CD) values are measured by means of Scanning Electron Microscopy (SEM) and then the operation of the stepper, the structure of a reticle which is associated with the process, of a parameter of the process which as been performed and which is responsible in part for the resulting CD's, is conventionally adjusted in order to bring an errant value or values into line with design requirements.

The above-mentioned stepper devices are, in the case of step-and-repeat lithographic systems, for example, effectively a cameras in which a workpiece is exposed over and over by two dimensional translations of the workpiece beneath the reticle. These steppers use reticles as the object whose image is projected either directly in a 1:1 projection system or through a stepper lens, onto the surface of a workpiece with the reduced image size. In the case of a reduced image system, the pattern transfer from the reticle to the mask on the wafer is accomplished by optically reducing the image to the correct dimensions while simultaneously focusing it onto a specified region of the wafer. After each exposure, the process continues with the wafer being translated to the next desired imaging position where the image is exposed again in the same way. The image is thus sequentially exposed, until the desired regions of the workpiece have been exposed.

Disclosure of the above-type of processes can be found U.S. Pat. No. 4,503,506 issued to Sturges, Jr. on Mar. 5, 1985, and U.S. Pat. No. 4,926,489 issued to Danielson et al. on May 15, 1999.

However, not every element on every die is monitored during the above-mentioned type of quality control, and it can be that some defects are not caught during the fabrication process. Nevertheless, post fabrication testing such as burn in, and the like can provide data pertaining to these type of as yet undetected problems.

One cause of this type of problem can be due to lens aberration. Due to a small imperfection in the formation of the lens, it can occur that the dimensions of an image which is projected onto a layer of photo-resist are either smaller, or otherwise sufficient deviant from those which are correctly generated by the reticle. This type of problem can result in a low yield wherein certain elements of the integrated circuit are defective.

On example of this type of problem are "opens" where connection between metal lines on different layers has not been established and a test voltage which is applied indicates that current is not able to flow along requisite paths. In this instance, once it is determined that this problem repetitively recurs at each of a series of imprintings, and that it cannot be corrected via the normal adjustments implemented during fabrication, then it can only be assumed that it is a small fault in the lens of the stepper optical system, which is the culprit.

Once it is determined that even the most optimum stepper/process adjustment will not resolve the yield differential problem, there are but few options. One is to not use the "bad" stepper which can cause problems with manufacturability, or the yield loss can be tolerated. Due to the cost of the stepper and the lost of productivity, neither of these option are deemed particularly acceptable.

SUMMARY OF THE INVENTION

In accordance with the present invention, if a yield signature is observed wherein a repetitive low yield pattern occurs within a given field of dies, and it can be determined to be coming from a particular layer that is being run on a particular stepper, for example, and cannot be corrected by normal adjustments to the stepper operation or process parameters, and it is further determined from results which are obtained with other steppers, that it is the lens of the stepper in question which is the source of the problem, then it is possible, in accordance with concept of the present invention, to reduce the yield loss by modifying the reticle so that, in combination with the localized lens aberration, the resulting CD's are rectified and meet the required design limitations.

This of course, means that the modified reticle can only be used with one lens arrangement and thus must be dedicated to the stepper in question. Nevertheless, this is far more acceptable than the above mentioned alternatives.

More specifically, a first aspect of the invention resides in a method of manufacturing semiconductor devices using a specified stepper having a predetermined lens and a predetermined reticle, the method comprising the steps of: determining the existence of a yield differential pattern during the production of semiconductor devices using the specified stepper device; determining that the yield differential pattern has characteristics which are consistent with the operation of the stepper which are repetitively located in predetermined locations consistent with repetitive image imprintation during semiconductor fabrication; modifying the reticle which is associated with the lens so as that the effect of the combination of the lens and the modified reticle result in errant fabrication features, which are the cause of the yield differential pattern, being reduced; and dedicating the modified reticle for use with the predetermined lens in the predetermined stepper.

In accordance with this aspect, before proceeding with the reticle modification the steps of: a) effecting adjustments to the operation of the stepper designed to rectify the yield differential following the step of determining that the yield differential pattern has characteristics which are consistent with the operation of the stepper; and b) establishing, before the step of modifying the reticle, that the yield differential is a result of aberration in the lens which is associated with the stepper and that errant fabrication features are generated in given localized locations and are a source of low yield and a cause of the yield differential, are carried out.

In the above, the step of determining the existence of a yield differential pattern includes determining the cyclic recurrence of errant critical dimensions in a predetermined layer.

A second aspect of the invention resides in a manufacturing arrangement for semiconductor devices which includes a stepper having a lens and a reticle, comprising: means for determining the existence of a yield differential pattern during the production of semiconductor devices using the specified stepper device; means for determining that the yield differential pattern has characteristics which are consistent with the operation of the stepper and which are repetitively located in predetermined locations consistent with repetitive image imprintation during semiconductor fabrication; means for modifying the reticle which is associated with the lens, so as that the effect of the combination of the lens and the modified reticle result in errant fabrication features, which are the cause of the yield differential pattern, being reduced, and for dedicating the modified reticle for use with the predetermined lens in the predetermined stepper.

The above arrangement further includes means for effecting adjustments to the operation of the stepper designed to rectify the yield differential prior to modifying the reticle using the reticle modifying means; and means for establishing that the yield differential is a result of an aberration in the lens which is associated with the stepper and that errant fabrication features which are generated in given localized locations and which do not concur with design specifications due to this aberration, are a source of low yield and a cause of the yield differential, and that reticle modification is required.

BRIEF DESCRIPTION OF THE DRAWINGS

The various aspects and advantages of the present invention will become better understood as a description of the preferred embodiments is given with reference to the appended drawings in which.

DETAILED DESCRIPTION OF THE PREFERRED EMBODIMENTS

Figure 1:
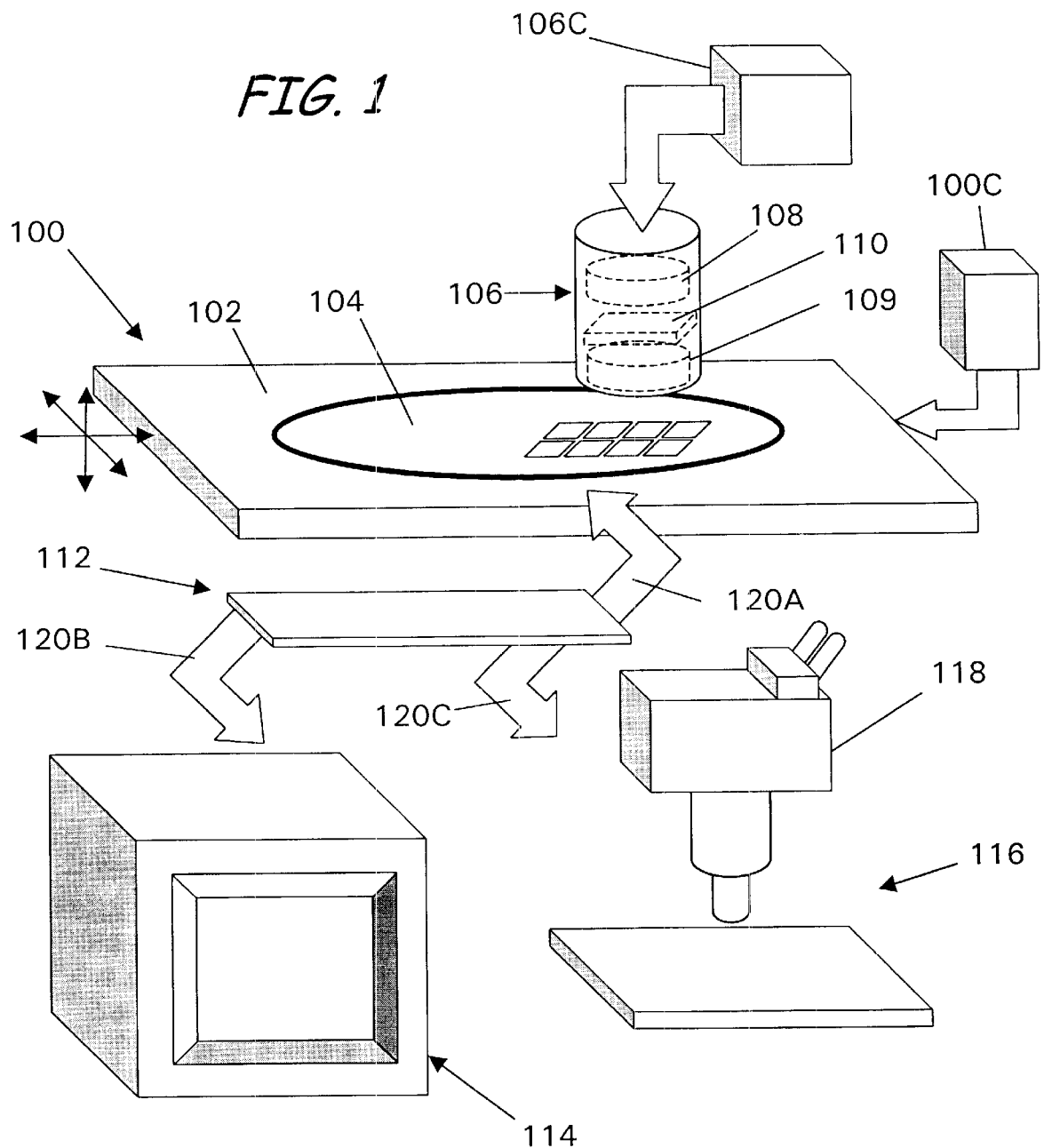
FIG. 1 is a schematic perspective view of a stepper which includes an optical system in which a reticle and a reducing/focussing lens cluster are mounted, and a moveable table on which a wafer is carried and move with respect to the optical system.
Figure 2:
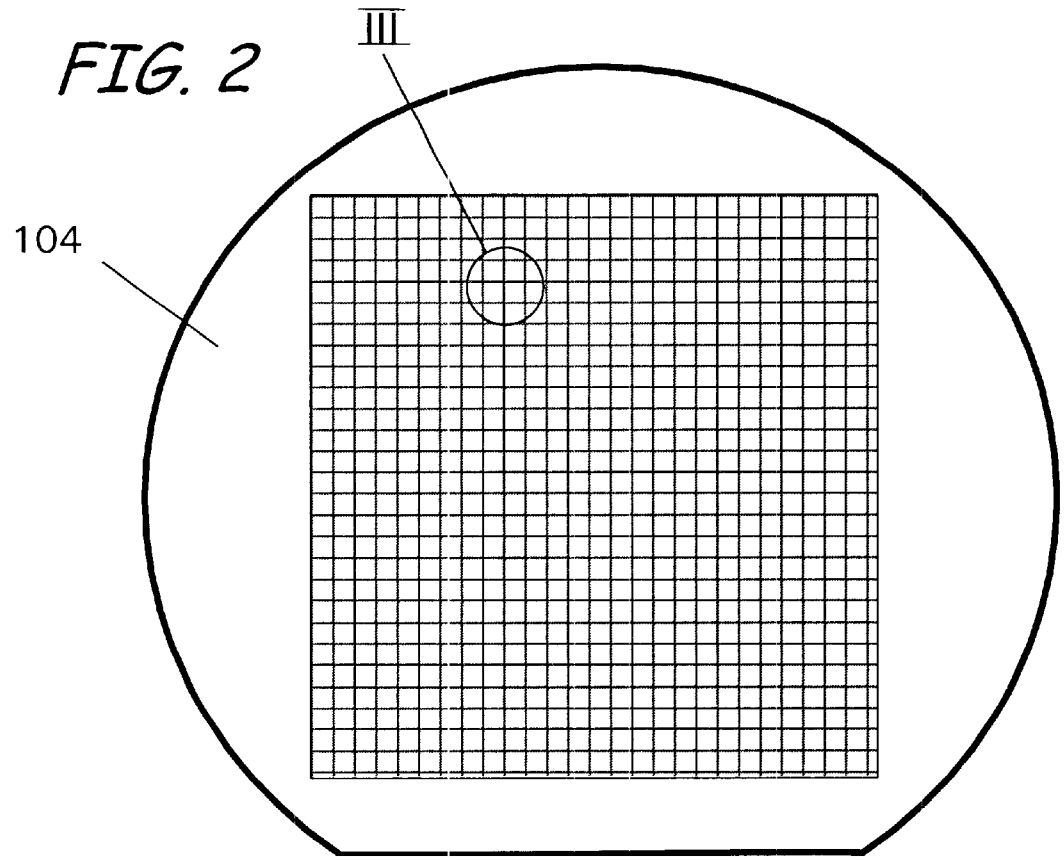
FIG. 2 is a plan view showing a wafer on which a plurality of die have been fabricated.

FIG. 1 schematically shows a stepper 100 which includes a table 102 adapted to support and hold wafers 104 thereon, and an optical system 106 which includes a source of radiant energy 108, focussing lens 109 and a reticle 110 which is interposed between the radiant source 108 and focussing lens 109, for determining the pattern which is imprinted on the wafer 104. A wafer track which is use to move the wafers to and from the stepper, is denoted by the numeral 112. In this figure, the wafer track 112 is shown as being arranged to transport the wafer 104 between the stepper 100, a processing unit 114 in which etching (for example) can be carried out, and a mapping station 116 in which the features which are formed, can be measured via an electron microscope or the like device 118. Robotics which are associated with the wafer track and which are used to move the wafers from one device to another are designated by the numerals 120A, 120B and 120C. The stepper and the optical systems are respectively connected with/include adjuster/controllers 100C and 106C.

As will be appreciated, this view is highly schematic and omits all but the outlines of the basic elements of the stepper 100, wafer track 112, processing unit or chamber 114, mapping station 116 and robotics 120A–120C. Further, only a limited number of chip outlines are shown on the wafer 104 and the overall arrangement is not drawn to scale nor is intended to accurately represent the actual structures of the respective devices. For further details pertaining to the construction, control and operation of steppers reference may be had to U.S. Pat. No. 5,392,361 issued on Feb. 21, 1995 in the name of Imaizumi et al. For details pertaining to wafer tracks and associated apparatus, reference may be had to U.S. Pat. No. 5,685,588 issued to Wong et al. on Nov. 11, 1997.

Figure 3:
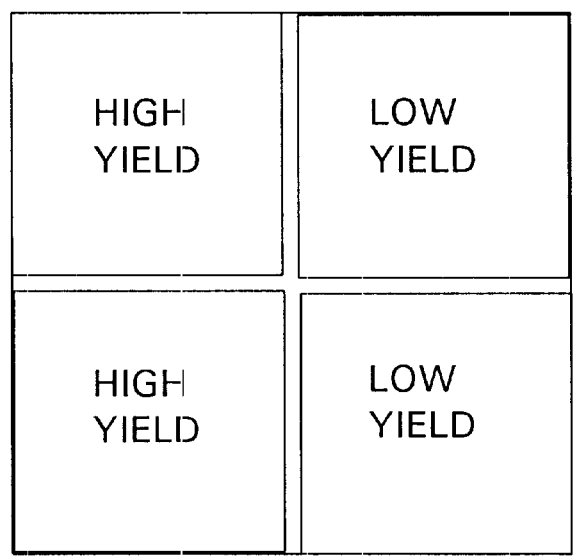
FIG. 3 is an enlarged view of the area within the circle denoted by III, depicting dies which have been produced and wherein the localized loss of yield has been noted.

Let it be assumed that the low yield shown in the two right hand dies depicted in FIG. 3, have been identified as being caused by low CD's in a polygate layer (by way of example) and are such as to cause high leakage; and/or are a result of a narrow connection line or point of inflexion in a connection line which is too narrow so as to exhibit an excessively high resistance and therefore such as to generate excess heat. Under these circumstances, it is possible to determine which feature on the reticle is associated with this problem and to increase the width of the image of the element or elements which are projected during fabrication so the net result of the lens aberration and the wide image, produces suitable results (i.e. a plus-minus-zero effect).

The reverse is also possible. More specifically, if the lens aberration is such as to cause a localized widening of an image at the time of projection, then it is possible to attempt to reduce the opening in the reticle which is responsible for this (i.e a "minus-plus-zero" effect).

However, once the reticle is modified and the effect of the erroneous image produced by the reticle and the effect on the image by the lens aberration are such as to cancel one another out and result in the elimination of the yield loss, then the reticle and lens must always be used together as a package when producing at least the layer which has been identified has exhibiting the errant CD's.

It should be noted that the detection of a fault signature which is corrected with the present invention is usually not caught during fabrication and is usually detected post fabrication during diagnostic processes wherein the tolerances of fuses, the successful transmission of test voltages and the like are carried out. That is to say, problems such as opens wherein metal wiring on one layer is not connected to the wiring on another level, problems wherein lines are too small or too big resulting in excessive resistance of shorting problems. Another harder to catch problem of course comes in the form of metal lines which are not measured per se, but which are too thin and which undergo electro-migration problems and will fail at some point in the future. It should also be noted that, while the field which is shown in FIG, 2, only shows the inclusion of a 2×2 array, it will be appreciated that this is only representative and that 20 or more die can be included in a field. In fact, that larger the number of die which are included, the easier the yield type signature is easier to establish.

While the invention as been described with reference to a limited number of examples, it is deemed that when equipped with the above concept that one of skill in the art would be able to implement a large number of adaptations which would permit the combined errors in the lens and that deliberately produced in the reticle to cancel one another and thus enable the desired CD's to be obtained with the complementary increase in productivity. The scope of the invention is therefore determined only the scope of the appended claims.

What is claimed is:

1. A method of manufacturing semiconductor devices using a specified stepper having a predetermined lens and a predetermined reticle which is associated with the lens, the method comprising the steps of:

determining the existence of a yield differential pattern during the production of semiconductor devices using the stepper;

determining, through a process of elimination, that the yield differential pattern has characteristics which are consistent with operation of the stepper;

effecting adjustments to the operation of the stepper designed to rectify the yield differential following the step of determining that the yield differential pattern has characteristics which are consistent with the operation of the stepper;

subsequent to effecting adjustment to the operation of the stepper, establishing that the yield differential is a result of an aberration in the predetermined lens which is associated with the stepper and that errant fabrication features are generated in given localized locations are a source of low yield, and a cause of the yield differential;

modifying the reticle so that the effect of the combination of the lens and the modified reticle result in the yield differential pattern being reduced; and dedicating the modified reticle for use with the predetermined lens in the predetermined stepper.

2. A method of manufacturing semiconductor devices as set forth in claim 1, wherein said step of determining the existence of a yield differential pattern includes determining the cyclic recurrence of one or more errant critical dimensions in a predetermined layer.

* * * * *